SEMICONDUCTOR DEVICES

Filed Aug. 11, 1959

INVENTOR.
HERBERT NELSON
BY
W. S. Hill
AGENT 2,972,092

SEMICONDUCTOR DEVICES

Herbert Nelson, Princeton, N.J., assignor to Radio Corporation of America, a corporation of Delaware Filed Aug. 11, 1959, Ser. No. 833,031

12 Claims. (Cl. 317—235)

This invention relates to semiconductor devices, and more particularly, to improved semiconductive circuit elements including at least one mesa, and to methods of making such devices.

Semiconductor devices and circuit elements generally comprise a body or wafer of monocrystalline semiconductive material which includes at least one rectifying barrier. The barrier may be of the point contact type or of the junction type. Junction devices may include one or more grown junctions, surface alloyed junctions, or diffused junctions. Diffused junction devices have become increasingly important because they can be mass produced under such conditions as to insure planar junctions at a precisely controlled depth below one face of the semiconductive wafer.

In many types of semiconductive circuit elements, particularly those intended to operate at high frequencies, it is important to delimit with precision the size and shape of the rectifying junctions. This accurate delimiting may be readily accomplished with diffused junctions in the following manner. A semiconductive wafer of one conductivity type is diffused with a conductivity type-determining substance, also known as an active impurity, so that a surface zone of the wafer is converted to opposite conductivity type, and a rectifying barrier is formed at the interface between the surface zone and the wafer interior. Thereafter a portion of the wafer surface is removed, down to and including the junction region. Such removal can be accomplished by grinding wheels, lapping techniques, or masking and etching processes. The remaining portion of the surface zone projects like a plateau or mesa on the wafer surface, and hence such devices are known as mesa transistors and mesa diodes. The size and shape of the junction which remains between the mesa and the wafer is thus controlled by and corresponds to the size and shape of the mesa. A mesa may also be utilized to delimit the size and shape of the source or sink in a unipolar transistor, in which case there is no rectifying barrier between the mesa and the wafer.

Although mesa devices have been found to exhibit desirable electrical characteristics, they are difficult to fabricate. It is necessary to attach an electrical lead wire to the mesa surface in a two-terminal device such as a mesa diode. In one embodiment of a mesa transistor, two electrical connections are usually made to the upper surface of the mesa, one for the emitter and the other for the base. Since the area of the mesa is necessarily small to provide good high frequency performance, and may measure less than 2 mils in diameter, it has been found very difficult to make the necessary connections to the mesa without causing a short circuit between the mesa and the wafer in two-terminal devices, or between the two leads in multi-electrode units such as transistors.

Accordingly, it is an object of this invention to provide a new and improved form of semiconductive circuit element.

Another object is to provide an improved two-terminal semiconductor device.

Still another object is to provide an improved method of making electrical connections to semiconductive mesa devices.

In general, the purposes and objects of this invention are accomplished by the provision of a semiconductor body or wafer having two opposed major faces, and at least one mesa of semiconductor material on one major face. An insulating coating is deposited on the one major face around each mesa. A conductive film is then applied over the top of, and in contact with, each mesa and over the top of the surrounding coating. An electrical connection may then be readily made to the mesa without forming a short circuit between the mesa and the bulk of the wafer.

The invention is described in greater detail with reference to the accompanying drawing, in which:

Figures 1*a*–1*f* are sectional views of successive steps in the fabrication of a two-terminal semiconductive circuit element in accordance with the invention;

Similar elements are designated by similar reference numerals throughout.

Figures 1, 2, 3, 4, 5:
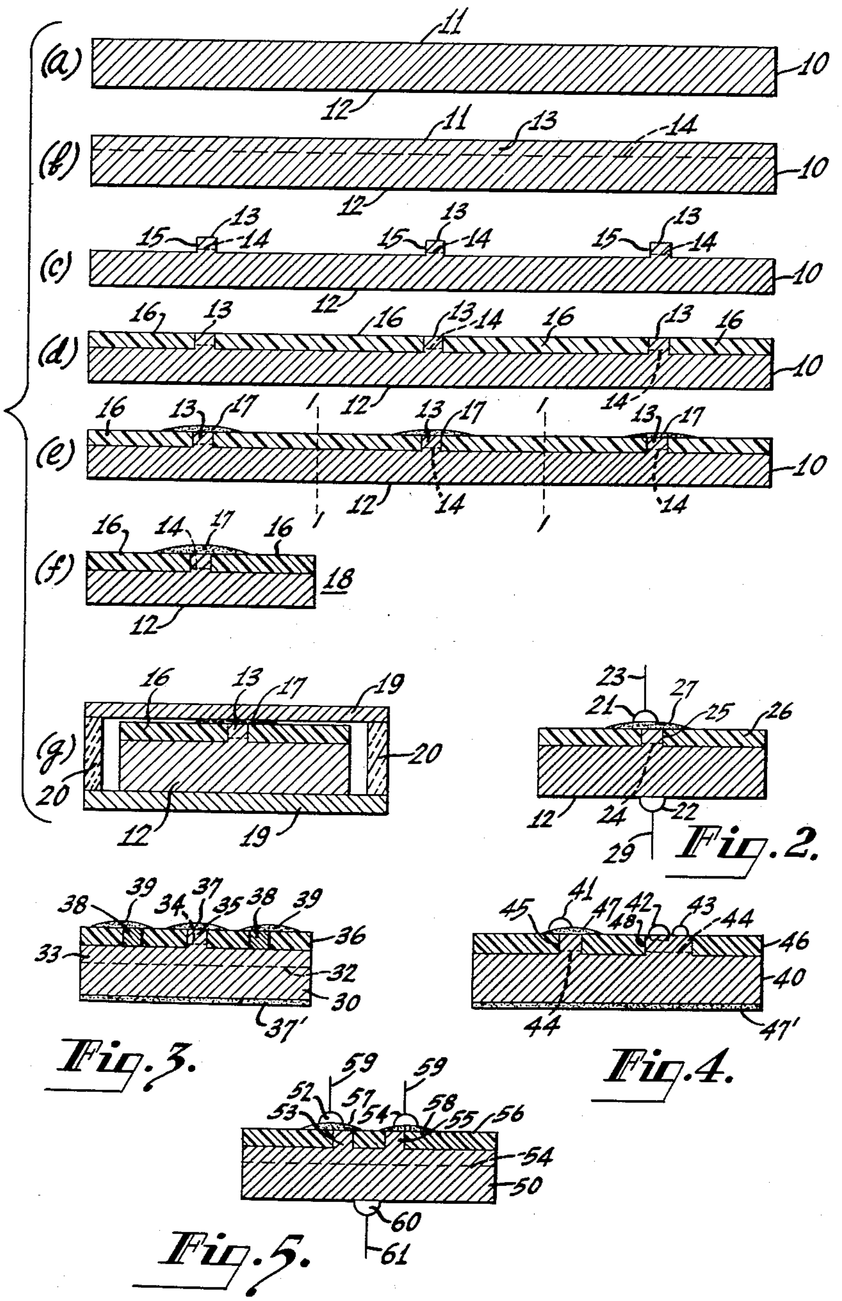
Figure 2 is a sectional view of a diode according to another embodiment of the invention.
Figure 3 is a sectional view of a triode transistor according to another embodiment of the invention.
Figure 4 is a sectional view of an integrated semiconductor device in accordance with the invention; and, Figure 5 is a sectional view of a unipolar transistor in accordance with the invention.

A preferred example of the fabrication of a two-terminal semiconductive circuit element according to the invention illustrates the preparation of a germanium mesa diode. However, it is to be understood that other crystalline semiconductors such as silicon, germanium-silicon alloys, and semiconductive compounds such as the phosphides, arsenides, and antimonides of aluminum, gallium, and indium may be utilized instead of germanium.

*Example*

Referring to Figure 1*a*, a wafer 10 of monocrystalline germanium is prepared with two opposed major faces 11 and 12. The exact dimensions of the wafer are not critical. In this example, the wafer 10 is about 500 mils square, 12 mils thick, and of N-type conductivity. The wafer 10 contains sufficient conductivity type-determining substance to have a resistivity of about .0005 to .005 ohm centimeters. In this example, since the semiconductor is germanium and N-type conductivity is desired, the appropriate conductivity type-determining substance is one which is a donor in germanium. Phosphorus, arsenic and antimony may be used as the type-determining substance. In this example, the wafer 10 contains about $2.8 \times 10^{19}$ atoms per cm.$^3$ of arsenic.

Referring to Figure 1*b*, a surface zone 13 adjacent one face 11 of wafer 10 is converted to opposite conductivity type. This may be accomplished by any convenient technique, such as diffusing an acceptor into wafer face 11. In this example, zone 13 is formed by flooding major wafer face 11 with a melt composed of 30 grams indium, 0.3 gram gallium and 4 grams germanium at a temperature of 515° C., cooling the melt and the wafer to a temperature of about 425° C. at which temperature a portion of the germanium precipitates and recrystallizes on wafer face 11 together with a portion of the dissolved indium and gallium, and then decanting the excess melt. The grown region 13 thus prepared contains about $9 \times 10^{19}$ acceptor atoms per cm.$^3$, and hence is strongly P-type. Under these conditions, this grown P-type layer 13 is about 1.5 mils thick. A rectifying barrier 14 is formed at the interface or junction between P-type zone 13 and the remaining N-type bulk of wafer 10.

Next, portions of the P-type surface zone 13 are removed by any convenient method, such as grinding wheels, lapping tools, or masking and etching processes. The thickness of the wafer portions removed is a little greater than the thickness of the P-type zone 13. The remaining portions of the P-type zone 13 thus form a plurality of plateaus or mesas 15 on the one major wafer face 11, as shown in Figure 1*c*. A rectifying barrier 14 is located between each mesa 15 and the bulk of the wafer 10.

Referring to Figure 1*d*, an insulating coating 16 is deposited on the one major wafer face 11 around the mesas 15. The insulating coating 16 fills up the surfaces between the mesas 15 and is preferably as thick as the height of the mesas, so that the top of coating 16 and the top of mesas 15 are substantially the same height above the one major face 11. The insulating coating 16 may be applied by any convenient method, such as painting, spraying, or dipping. In this example, a quantity of the insulating coating 16 is applied to major wafer face 11 over and around the mesa 15, then allowed to harden. Thereafter the excess coating is removed by lapping until the top of the coating 16 and the top of mesa 15 is substantially the same height above wafer face 11.

A wide variety of inorganic and organic insulating materials may be utilized for coating 16, the only requirement being that the insulating material should be stable at the temperatures which the device will encounter in normal operation. Germanium units are not operated at temperatures over 100° C.; silicon units are usually kept at temperatures below 250° C.; devices made of semiconductive compounds such as gallium arsenide are usually operated at temperatures below 500° C. It is thus seen that a wide range of inorganic insulators such as refractory oxides, and a wide range of organic insulators such as synthetic resins, may be utilized in this invention. The resins may be thermosetting, such as the phenolics and ureas, or thermoplastic, such as the polyesters, polystyrene, and the polyvinyls. Also useful for this purpose are the high polymers of materials such as polyvinyl chloride, monochlorotrifluoroethylene, and tetrafluoroethylene. In this example, the insulating coating 16 consists of an epoxy resin. The types of epoxy resin commercially available under the trademark "Araldite" has been found suitable for this purpose. One such suitable coating is formed by a mixture of 10 parts by weight Araldite Epoxy Resin No. 502 and 1 part by weight Araldite Hardener No. 951.

Next (Figure 1*e*), an electrically conductive film 17 is deposited over the mesas 15 and the surrounding insulating coating 16. Films metals such as nickel, copper, tin, lead, and indium are suitable for this purposes, and may be deposited by any convenient technique, such as evaporating, plating, or dipping. Electrically conductive films consisting of special conductive plastics may also be utilized. The conductive plastics are usually loaded with silver or the like. In this example, a metallic conductive film 17 consisting of induim is deposited by vacuum evaporation to a thickness of about 0.1 to 0.5 mil.

If desired, the wafer 10 may be suitably masked during the evaporation step, so that the conductive film 17 is deposited only in area about 5–15 mils in diameter over the top of each mesa. In this example, the indium film 17 is deposited in areas about 10 mils in diameter over each mesa 15, leaving the wafer as shown in Figure 1*e*.

Next, the wafer 10 is broken along planes which include the dashed lines 1—1 in Figure 1*e*, and along planes transverse to the aforesaid planes, thus separating the wafer into a plurality of units. One such unit 18 is shown in Figure 1*f*. This two-terminal device comprises a semiconductive body including a P-type region 13 separated from an N-type region by a rectifying barrier 14, as in conventional diodes. However, since both the P-type and N-type regions of the device have been doped to the point of degeneracy, operation of the unit results in the phenomenon known as tunneling, and the device exhibits a negative resistance region in one portion of the I–V curve. For a description of such devices, see "Tunnel Diodes as High-Frequency Devices," by H. S. Sommers, Jr., Proceedings of the IRE, July 1959, pages 1201–1206.

For high frequency operation, the tunnel diode 18 is preferably mounted in such manner that the base has a low series impedance. The pigtail connection of normal transistor stems introduces too much inductance for this purpose. A satisfactory low inductance mount for the tunnel diode 18 of Figure 1*f* is shown in Figure 1*g*, and consists of two ⅛" nickel ribbons 19 bonded on either side of two ceramic spacers 20. The diode 18 is mounted in the opening between the spacer 20, with face 12 soldered to the inner face of the lower nickel ribbon, and metal film 17 soldered to the inner face of the upper nickel ribbon. If desired, the structure is made more rigid by subsequently filling the opening between the nickel ribbons with a plastic or resin such as Araldite.

Many modifications and variations may be made without departing from the spirit and scope of the invention. For example, instead of dividing wafer 10 at the step shown in Figure 1*e* into a plurality of discrete units, the wafer 10 may be left intact and operated as a matrix or array of diodes.

Although the invention has been described above in connection with a tunnel diode, it will be understood that this is by way of illustration only, and not a limitation. Other crystalline semiconductors may be utilized instead of germanium, and the conductivity type of the various regions may be reversed. The invention is equally applicable to other semiconductor devices such as transistors, and to various two-terminal devices including conventional diodes, variable capacitance diodes, and PNPN diodes.

A diode without a negative resistance characteristic may be fabricated in a manner similar to that described above in connection with Figure 1, but maintaining the active impurity concentration at a level of about $10^{15}$ to $10^{18}$ atoms per $cm.^3$, which is well below the degenerate region. A diode unit 28 thus prepared is shown in Figure 2. The device includes an N-conductivity type mesa 25 on a P-conductivity type germanium wafer 28, and a PN junction 24 between the N-type mesa and the P-type bulk of the wafer. An insulating coating 26 is deposited around the mesa 25, and a conductive film 27 is evaporated over the mesa and a portion of coating 26. In this example, film 27 consists of tin. The unit is completed by bonding a tin-lead pellet 21 to the conductive film 27, and bonding an indium-lead pellet 22 to the opposite face of the unit. In each case, bonding may be accomplished by either alloying or soldering. As shown in the drawing, the pellet 21 need not be centered over the mesa 25, since the insulating coating 26 prevents any short circuit between the mesa 25 and sourrounding surface of the wafer. The lateral area of the pellet 21 may be greater than the area of the mesa 25. Lead wires 23 and 29 are next attached to electrodes 21 and 22 respectively, and the device is encapsulated and cased by conventional methods.

Figure 3 illustrates a triode transistor in accordance with the invention. An active impurity is diffused into a given conductivity type semiconductor wafer 30 having two opposed major faces. A rectifying barrier 32 and 34 is thereby formed beneath each major face. Between the barriers 32 and 34 is a zone 33 of original conductivity type, which becomes the base region of the transistor. A portion of the diffused region on one major face is removed, leaving a mesa 35. A part of one rectifying barrier 34 remains between the mesa 35 and zone 33. Next, a ring-shaped base electrode 38 is bonded to the wafer around the mesa 35. Electrode 38 is formed of a metal which is electrically inert with respect to the wafer, and hence forms an ohmic contact to the base region 33. An insulating coating 36 is then deposited over the one major wafer face around mesa 35 and electrode 38. Thereafter the wafer is masked, a conductive film 37 is deposited over the top of and in contact with mesa 35 and a portion of the surrounding insulating coating, and a similar conductive film 37' is deposited on the opposite major wafer face. A conductive film 39 is simultaneously or subsequently deposited over the top of and in contact with the base electrode 38, and also over a portion of insulating coating 36 extending outward from the base electrode. It will be seen that by the use of electrode pellets as previously discussed in connection with Figure 2, an emitter contact can now be readily made to film 37, a base contact to film 39, and a collector contact to film 37', without any difficulty from short circuits between emitter and base. Alternatively, film 37' may be omitted and a collector contact made by alloying an electrode pellet or impurity dot to the opposite major wafer face.

The principles of the invention may also be applied to integrated semiconductive devices in which a single semiconductive wafer performs various circuit functions by means of a plurality of active and passive components integrated into the one wafer. See for example J. T. Wallmark and S. M. Marcus, "Integrated Semiconductor Devices," RCA Engineer, vol. 5, No. 1, pages 42–45. One useful integrated device comprises a rectifying diode-triode transistor on a single semiconductor wafer. The advantages of such a diode-triode circuit element for detection, automatic gain control and audio amplification in transistorized receivers are discussed by D. Thorne and R. V. Fournier, "New Diode-Triode Transistor for Detector-Driver Service," RCA Engineer, vol. 5, No. 1, pages 38–41. An integrated diode-triode circuit element according to the invention as illustrated in Figure 4, and comprises a given conductivity type semiconductor wafer 40 having two mesas 45 and 48 of opposite conductivity to the given type on one major face. Between each mesa and the bulk of wafer 40 is a rectifying barrier or PN junction 44. A rectifying electrode 42 and a non-rectifying or ohmic electrode 43 are alloyed to the upper surface of one mesa 48. Insulating coating 46 deposited on the one major face surrounds mesa 45 and mesa 48. Conductive film 47 is deposited over mesa 45 and a portion of the surrounding insulating coating 46. A similar conductive film 47' is deposited on the opposite major wafer face. An electrode pellet 41 may now be alloyed or soldered to conductive film 47 without danger of a short circuit to the wafer 40 or to the other mesa 48. The device is completed by attaching lead wires (not shown) to electrodes 41, 42, 43 and to the conductive film 47'.

The principles of the invention may also be applied to other semiconductor devices such as unipolar transistors and double-base diodes. A unipolar transistor in accordance with the invention is illustrated in Figure 5, and comprises a semiconductive wafer 50 containing a single rectifying barrier 54 between two opposing major faces. On one major face are two mesas 53 and 55, but in this embodiment there are no rectifying barriers between the mesas and the wafer. Insulating coating 56 covers the one major face and surrounds mesas 53 and 55. Conductive film 57 is deposited over mesa 53 and a portion of the surrounding coating 56, and conductive film 58 is similarly deposited over mesa 55 and a portion of the surrounding coating. Ohmic electrode pellets 52 and 54 are bonded to conductive films 57 and 58 respectively by soldering or alloying, and electrode pellet 60 is similarly bonded to the opposite major wafer face. To complete the device, lead wires 51, 59 and 61 are attached to electrodes 52, 54 and 60 respectively. In operation, lead wire 51 is the source connection, lead wire 59 is the drain connection, and lead wire 61 is the gate connection. For high frequency operation, it is desirable that the source and drain be very close together. Previously it has been difficult to make separate electrical connections to the source and drain regions without considerable scrap due to short circuits. It will be seen that in the instant device this problem is solved, since electrode pellets 52 and 54 need not be as close together as the mesas 53 and 55. Moreover, the lateral area of each electrode pellet may be greater than the area of the mesa beneath it, thus facilitating the attachment of lead wires.

What is claimed is:

1. A circuit element comprising a semiconductor wafer having two opposed major faces; at least one mesa of semiconductor material on one of said major wafer faces; an insulating coating on said one major wafer face around each said mesa; and a conductive film over the top of, and in contact with, each said mesa and the surrounding coating.

2. A circuit element comprising a semiconductor wafer having two opposed major faces; at least one mesa on one of said major wafer faces; an insulating coating on said one major wafer face around each said mesa, the top of said coating and the top of each said mesa being substantially the same height above said one major wafer face; and a conductive film over the top of, and in contact with, each said mesa and the surrounding coating.

3. A circuit element comprising a semiconductor wafer having two opposed major faces; at least one mesa on one of said major wafer faces; a rectifying barrier between each said mesa and the bulk of said wafer; an insulating coating on said one major wafer face around each said mesa; and a conductive film over the top of, and in contact with, each said mesa and the surrounding coating.

4. A circuit element comprising a semiconductor wafer having two opposed major faces; at least one mesa on one of said major wafer faces; a rectifying barrier between each said mesa and the bulk of said wafer; an insulating coating on said one major wafer face around each said mesa, the top of said coating and the top of each said mesa being substantially the same height above said one major wafer face; and a conductive film over the top of, and in contact with, each said mesa and the surrounding coating.

5. A circuit element comprising a semiconductor wafer having two opposed major faces; at least one mesa on one of said major wafer faces; a rectifying barrier between each said mesa and the bulk of said wafer; an insulating synthetic resin coating on said one major wafer face around each said mesa; and a conductive film over the top of, and in contact with, each said mesa and the surrouning coating.

6. A circuit element comprising a semiconductor wafer having two opposed major faces; at least one mesa on one of said major wafer faces; a rectifying barrier between each said mesa and the bulk of said wafer; an insulating synthetic resin coating on said one major wafer face around each said mesa; and a conductive film over the top of, and in contact with, each said mesa and the surrounding coating.

7. A circuit element comprising a semiconductor wafer having two opposed major faces; a mesa on one of said major wafer faces; a rectifying barrier between said mesa and the bulk of said wafer; an insulating coating on said one major wafer face around said mesa; and a conductive film over the top of, and in contact with, said mesa and the surrounding coating.

8. A two-terminal device comprising a semiconductor wafer having two opposed major faces; a surface zone of given conductivity type on said wafer including one of said major faces; an opposite conductivity type mesa on said other of said major faces; a rectifying barrier between said mesa and said surface zone; an insulating coating on said other major face around said mesa; a conductive film over the top of, and in contact with, said mesa and the top of the surrounding coating; and electrical leads to said conductive film and to the opposite major face.

9. A two-terminal device comprising a semiconductor wafer having two opposed major faces; a surface zone of given conductivity type on said wafer including one of said major wafer faces; an opposite conductivity type mesa on said other of said major faces; a rectifying barrier between said mesa and said surface zone; an insulating synthetic resin coating on said other major face around said mesa; a metal film over the top of, and in contact with, said mesa and the top of the surrounding coating; and electrical leads to said metal film and to the opposite major face.

10. A triode circuit element comprising a semiconductor wafer having two opposed major faces; a mesa on one of said major faces; a given conductivity type zone in said wafer intermediate said mesa on said one major face and an opposite conductivity type zone adjacent the other major face; a rectifying barrier between said mesa and said intermediate zone; a rectifying barrier between said intermediate zone and said opposite conductivity type zone; a ring-shaped metal electrode bonded to said one major face around said mesa; an insulating coating over said one major face around said mesa and said electrode; a conductive film over the top of, and in contact with, said mesa and a portion of the surrounding insulating coating; and a conductive film over the top of, and in contact with, said electrode and a portion of the surrouding insulating coating.

11. An integrated diode-triode circuit element comprising a semiconductor wafer having two opposed major faces; two mesas on one of said major faces; a rectifying barrier between each said mesa and said wafer; an insulating coating on said one face around said mesas; a conductive film over the top of, and in contact with, one said mesa and a portion of said surrounding coating; an electrode pellet alloyed to said conductive film; a rectifying electrode and an ohmic electrode alloyed to the upper surface of the other mesa; and a conductive film on the major wafer face opposite said one face.

12. A unipolar circuit element comprising a semiconductor wafer having two opposed major faces; a rectifying barrier between said faces; two mesas on one of said major wafer faces; an insulating coating on said one face around said mesas; conductive films over the top of, and in contact with, each said mesa and a portion of said surrounding coating; an electrode pellet bonded to each said film and to the opposite major face; and lead wires attached to each said electrode pellet.

References Cited in the file of this patent

UNITED STATES PATENTS

| | | |
|---|---|---|
| 2,680,220 | Starr et al. | June 1, 1954 |
| 2,781,480 | Mueller | Feb. 12, 1957 |
| 2,911,539 | Tanenbaum | Nov. 3, 1959 |